(12) United States Patent
Mochizuki et al.

(10) Patent No.: US 11,239,360 B2
(45) Date of Patent: Feb. 1, 2022

(54) VERTICAL TRANSPORT FIELD EFFECT TRANSISTOR STRUCTURE WITH SELF-ALIGNED TOP JUNCTION THROUGH EARLY TOP SOURCE/DRAIN EPITAXY

(71) Applicant: INTERNATIONAL BUSINESS MACHINES CORPORATION, Armonk, NY (US)

(72) Inventors: Shogo Mochizuki, Clifton Park, NY (US); Brent A. Anderson, Jericho, VT (US); Hemanth Jagannathan, Niskayuna, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 98 days.

(21) Appl. No.: 16/743,880

(22) Filed: Jan. 15, 2020

(65) Prior Publication Data
US 2020/0152791 A1    May 14, 2020

Related U.S. Application Data

(63) Continuation of application No. 16/018,606, filed on Jun. 26, 2018, now Pat. No. 10,593,797.

(51) Int. Cl.
*H01L 29/78* (2006.01)
*H01L 29/66* (2006.01)
(Continued)

(52) U.S. Cl.
CPC .......... *H01L 29/7827* (2013.01); *H01L 21/56* (2013.01); *H01L 21/823487* (2013.01);
(Continued)

(58) Field of Classification Search
CPC .................................................. H01L 29/7827
See application file for complete search history.

(56) References Cited

U.S. PATENT DOCUMENTS 6,770,534 B2    8/2004    Cho et al.
7,683,428 B2    3/2010    Chidambarrao et al.
(Continued)

OTHER PUBLICATIONS

List of IBM Patents or Patent Applications Treated as Related dated Jan. 15, 2020, 2 pages.
(Continued)

*Primary Examiner* — William A Harriston
(74) *Attorney, Agent, or Firm* — Tutunjian & Bitetto, P.C.; Erik Johnson

(57) ABSTRACT

A method of forming a vertical transport field effect transistor is provided. The method includes forming a vertical fin on a substrate, and a top source/drain on the vertical fin. The method further includes thinning the vertical fin to form a thinned portion, a tapered upper portion, and a tapered lower portion from the vertical fin. The method further includes depositing a gate dielectric layer on the thinned portion, tapered upper portion, and tapered lower portion of the vertical fin, wherein the gate dielectric layer has an angled portion on each of the tapered upper portion and tapered lower portion. The method further includes depositing a work function metal layer on the gate dielectric layer.

19 Claims, 6 Drawing Sheets

(51) Int. Cl.
    *H01L 29/08*    (2006.01)
    *H01L 21/56*    (2006.01)
    *H01L 21/8234*  (2006.01)
    *H01L 29/417*   (2006.01)

(52) U.S. Cl.
    CPC .... *H01L 29/0847* (2013.01); *H01L 29/66666* (2013.01); *H01L 29/41783* (2013.01); *H01L 29/785* (2013.01)

(56) References Cited

U.S. PATENT DOCUMENTS

| | | |
|---|---|---|
| 9,299,835 B1 | 3/2016 | Anderson et al. |
| 9,431,305 B1 | 8/2016 | Anderson et al. |
| 9,530,866 B1 | 12/2016 | Zhang et al. |
| 9,640,636 B1 | 5/2017 | Bentley et al. |
| 9,735,253 B1 | 8/2017 | Bi et al. |
| 9,748,380 B1 | 8/2017 | Lie et al. |
| 2006/0261406 A1 | 11/2006 | Chen |
| 2009/0258470 A1 | 10/2009 | Choi et al. |
| 2012/0025286 A1* | 2/2012 | Nojima ............. H01L 29/0657 257/296 |

OTHER PUBLICATIONS

Yakimets et al., "Vertical GAAFETs for the Ultimate CMOS Scaling", IEEE Transactions on Electron Devices. vol. 62. Issue No. 5. May 2015. pp. 1433-1439.

* cited by examiner

VERTICAL TRANSPORT FIELD EFFECT TRANSISTOR STRUCTURE WITH SELF-ALIGNED TOP JUNCTION THROUGH EARLY TOP SOURCE/DRAIN EPITAXY

BACKGROUND

Technical Field

The present invention generally relates to vertical transport field effect transistors (VT FETs), and more particularly to forming top source/drains for VT FETs.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a vertical transport field effect transistor is provided. The method includes forming a vertical fin on a substrate, and a top source/drain on the vertical fin. The method further includes thinning the vertical fin to form a thinned portion, a tapered upper portion, and a tapered lower portion from the vertical fin. The method further includes depositing a gate dielectric layer on the thinned portion, tapered upper portion, and tapered lower portion of the vertical fin, wherein the gate dielectric layer has an angled portion on each of the tapered upper portion and tapered lower portion. The method further includes depositing a work function metal layer on the gate dielectric layer.

In accordance with another embodiment of the present invention, a method of forming a vertical transport field effect transistor is provided. The method includes forming a vertical fin on a substrate, and a top source/drain on the vertical fin. The method further includes thinning the vertical fin to form a thinned portion having a width in a range of about 2 nm to about 25 nm, a tapered upper portion, and a tapered lower portion from the vertical fin. The method further includes depositing a gate dielectric layer on the thinned portion, tapered upper portion, and tapered lower portion of the vertical fin, wherein the gate dielectric layer has an angled portion on each of the tapered upper portion and tapered lower portion.

In accordance with yet another embodiment of the present invention, a vertical transport field effect transistor is provided. The vertical transport field effect transistor includes a vertical fin including a thinner portion, an upper tapered portion, and a lower tapered portion on a substrate. The vertical transport field effect transistor further includes a top source/drain on the upper tapered portion. The vertical transport field effect transistor further includes a gate dielectric layer on the vertical fin, wherein the gate dielectric layer has an angled portion on each of the tapered upper portion and tapered lower portion. The vertical transport field effect transistor further includes a work function metal layer on the gate dielectric layer, wherein the work function metal layer has a thinner section adjacent to the upper tapered portion of the vertical fin; and an encapsulation layer on the work function metal layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of aligning top source/drain junctions with gate structures to control junction positions and to reduce variability of junction positions, such as underlap or overlap.

Embodiments of the present invention provide a method of constricting the channel region to align top source/drain junctions with gate structures to control junction positions and to reduce variability of junction positions, such as underlap or overlap.

Exemplary applications/uses to which the present invention can be applied include, but are not limited to: VT FETs for logic devices and memory devices.

It is to be understood that aspects of the present invention will be described in terms of a given illustrative architecture; however, other architectures, structures, substrate materials and process features and steps can be varied within the scope of aspects of the present invention.

Figure 1:
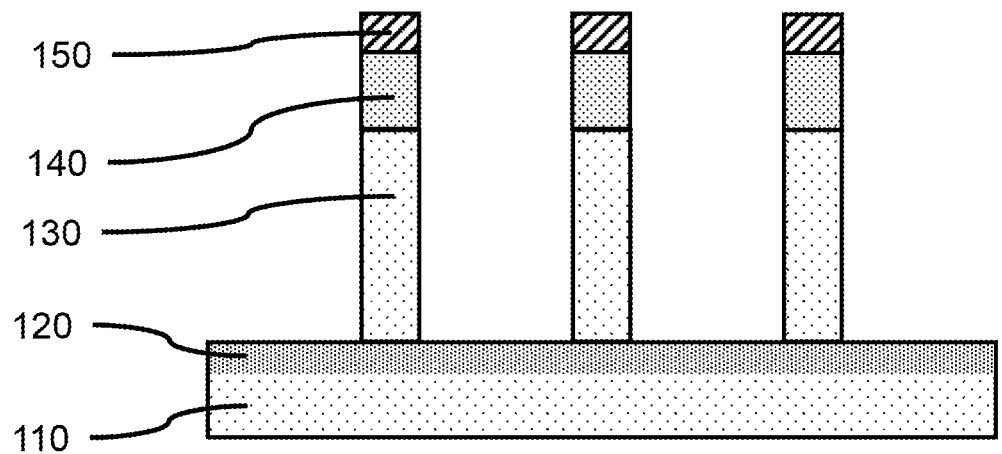
FIG. 1 is a cross-sectional view showing a plurality of vertical fins on a source/drain layer and substrate with top source/drains and masking caps on each vertical fin, in accordance with an embodiment of the present invention.

Referring now to the drawings in which like numerals represent the same or similar elements and initially to FIG. 1, a cross-sectional view showing a plurality of vertical fins on a source/drain layer and substrate with top source/drains and masking caps on each vertical fin is shown, in accordance with an embodiment of the present invention.

In one or more embodiments, a plurality of vertical fins 130 can be formed on a substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 130 may be formed by a direct write process or double patterning process using, for example, immersion lithography, extreme ultraviolet lithography, or x-ray lithography.

In various embodiments, the vertical fins 130 can have a width in a range of about 5 nanometers (nm) to about 30 nm, or about 5 nm to about 10 nm, or about 10 nm to about 30 nm, although other widths are also contemplated.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The substrate 110 can include a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-gallium-arsenide (InGaAs), indium-phosphide (InP), indium-antimonide (InSb)), or a II-VI semiconductor (e.g., cadmium-telluride (CdTe), zinc-telluride (ZnTe), zinc sulfide (ZnS), zinc selenide (ZnSe)).

In one or more embodiments, a masking cap 150 can be formed on the vertical fins 130 as part of the patterning process. In various embodiments, each of the masking caps 150, can be a hardmask layer that can be made of a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof.

In one or more embodiments, a top source/drain 140 can be formed on each of the vertical fins 130 as part of the patterning process, where a top source/drain layer is formed on the substrate and portions of the source/drain layer are etched away to form the top source/drains 140. The top source/drain 140 can be doped to be an n-type source/drain, for example, with phosphorus (P) or arsenic (As), or a p-type source/drain, for example, with boron (B) or gallium (Ga).

In one or more embodiments, a bottom source/drain layer 120 can be formed at the surface of the substrate 110 below the vertical fins 130. The bottom source/drain layer 120 can be formed by epitaxial or heteroepitaxial growth on a crystalline surface of the substrate 110 or by dopant implantation into the surface of the substrate after formation of the vertical fins 130.

The top source/drains 140 and bottom source/drain layer 120 can be a crystalline semiconductor material, including, but not limited to, silicon (Si), silicon carbide (SiC), silicon-germanium (SiGe), and germanium (Ge), that can include a dopant. The dopant can be an n-type dopant (e.g., phosphorus (P), arsenic (As)) or p-type dopant (e.g., boron (B), gallium (Ga)). The dopant can be introduced into the bottom source/drain layer 120 during formation (i.e., in situ) or after formation (i.e., ex situ), for example, ion implantation.

Figure 2:
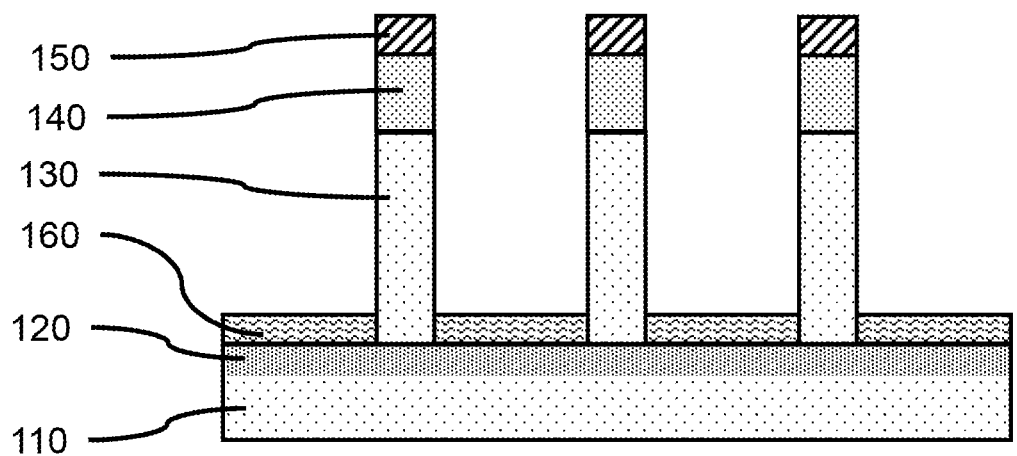
FIG. 2 is a cross-sectional view showing a plurality of vertical fins on a source/drain layer and substrate with a bottom spacer layer on the source/drain layer, in accordance with an embodiment of the present invention.

FIG. 2 is a cross-sectional view showing a plurality of vertical fins on a source/drain layer and substrate with a bottom spacer layer on the source/drain layer, in accordance with an embodiment of the present invention.

In one or more embodiments, a bottom spacer layer 160 can be formed on the bottom source/drain layer 120, where the bottom spacer layer 160 can be formed by a directional deposition, for example, a high density plasma (HDP) deposition or a gas cluster ion beam (GCIB) deposition.

In one or more embodiments, the bottom spacer layer 160 can be formed to a thickness in the range of about 3 nm to about 15 nm, or about 5 nm to about 10 nm, although other thicknesses are also contemplated.

In various embodiments, the bottom spacer layer 160 can be a dielectric material, including, but not limited to silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof.

Figure 3:
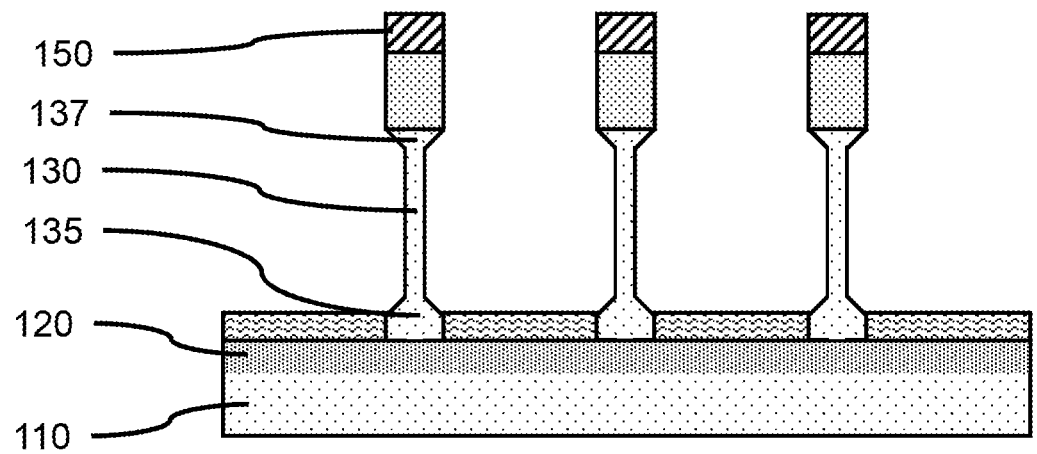
FIG. 3 is a cross-sectional view showing a plurality of vertical fins with thinned sections and tapered sections, in accordance with an embodiment of the present invention.

FIG. 3 is a cross-sectional view showing a plurality of vertical fins with thinned sections and tapered sections, in accordance with an embodiment of the present invention.

In one or more embodiments, an portion of the vertical fins 130 exposed above the bottom spacer layer 160 can be thinned using a non-isotropic wet chemical etch, for example, ammonium hydroxide ($NH_3OH$), or tetramethyl ammonium hydroxide TMAH, that preferentially removes the material of the vertical fins 130 from specific crystal faces. Thinning of the vertical fins 130 using a lateral etch can form tapered upper portion 137 and tapered lower portions 135 of the vertical fins proximal to the top source/drains 140 and bottom source/drain layer 120, respectively.

In various embodiments, the thinned portion of the vertical fins 130 can have a width in a range of about 2 nanometers (nm) to about 25 nm, or about 5 nm to about 25 nm, or about 2 nm to about 10 nm, although other widths are also contemplated.

Figure 4:
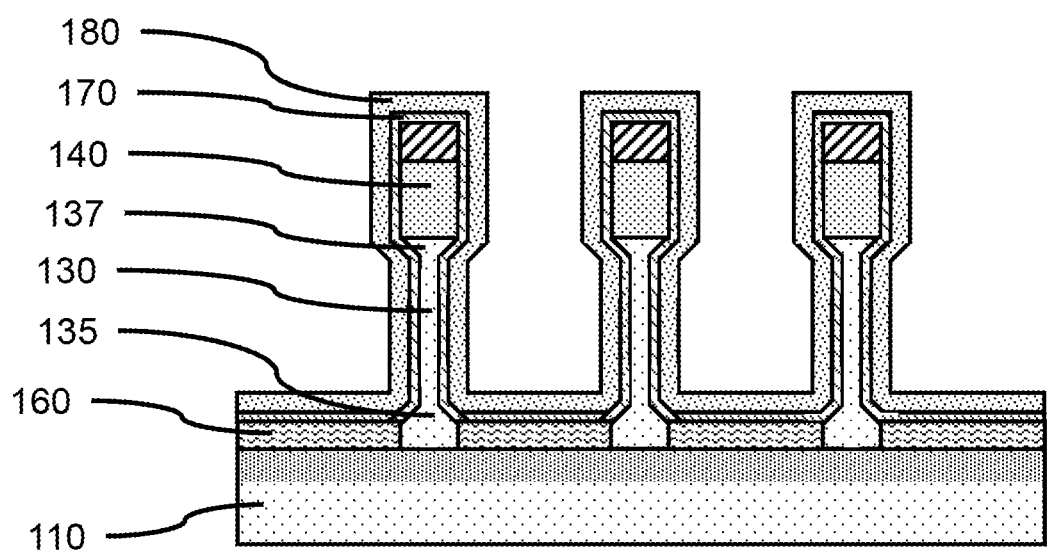
FIG. 4 is a cross-sectional view showing a gate dielectric layer and a work function metal layer on the plurality of vertical fins, in accordance with an embodiment of the present invention.

FIG. 4 is a cross-sectional view showing a gate dielectric layer and a work function metal layer on the plurality of vertical fins, in accordance with an embodiment of the present invention.

In one or more embodiments, a gate dielectric layer 170 can be formed on the exposed surfaces of the vertical fins 130, mask caps 150, and bottom spacer layer 160. The gate dielectric layer 170 can be formed by a conformal deposition, for example, atomic layer deposition (ALD) plasma enhanced ALD (PEALD), or a combination thereof.

In various embodiments, the gate dielectric layer 170 can have a thickness in the range of about 0.5 nm to about 5 nm, or about 0.5 nm to about 2 nm, or about 2 nm to about 5 nm, although other thicknesses are also contemplated. The thickness of the gate dielectric layer 170 can be less than the amount that the vertical fins are thinned.

In various embodiments, the gate dielectric layer 170 can be an insulating, dielectric material, including, but not limited to, silicon oxide (SiO), silicon nitride (SiN), silicon oxynitride (SiON), a high-K dielectric, or a suitable combination of these materials.

The high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb$(Sc_xTa_{1-x})O_3$), and lead zinc niobate (e.g., $PbZn_{1/3} Nb_{2/3} O_3$). The high-k material can further include dopants such as lanthanum and/or aluminum. The stoichiometry of the high-K compounds can vary.

In one or more embodiments, a work function metal layer 180 can be formed on the gate dielectric layer 170, where the work function metal layer 180 can be formed by a conformal deposition (e.g., atomic layer deposition (ALD) or plasma enhanced ALD (PEALD)).

In various embodiments, the work function metal layer 180 can include, but not necessarily be limited to, titanium nitride (TiN), tantalum nitride (TaN) or ruthenium (Ru), for a PFET. The work function metal layer 180 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or lanthanum (La) doped TaN, for an NFET.

The work function metal layer 180 can have a thickness in the range of about 2 nm to about 15 nm, or about 2 nm to about 5 nm, or about 5 nm to about 15 nm, although other thicknesses are also contemplated.

In one or more embodiments, a gate structure can include a gate dielectric layer and a work function metal layer. The gate dielectric layer 170 and work function metal layer 180 can cover the tapered portions 135, 137 and thinned portion of the vertical fins 130, such that the gate dielectric layer 170 and work function metal layer 180 can have angled portions on the tapered portions 135, 137 depending on the thicknesses of the gate dielectric layer 170 and work function metal layer 180.

Figure 5:
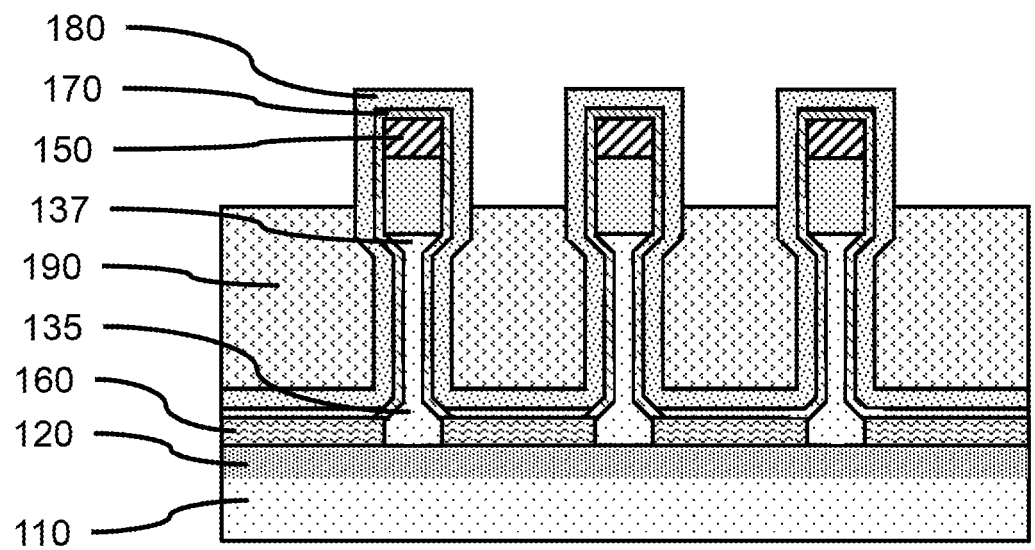
FIG. 5 is a cross-sectional view showing a fill layer on the plurality of vertical fins and work function metal layer, in accordance with an embodiment of the present invention.

FIG. 5 is a cross-sectional view showing a fill layer on the plurality of vertical fins and work function metal layer, in accordance with an embodiment of the present invention.

In one or more embodiments, a fill layer 190 can be formed on the work function metal layer 180 and substrate 110, where the fill layer 190 can be formed by a blanket deposition (e.g., CVD, spin-on). The fill layer 190 can be a polymeric material, for example, tetraethyl orthosilicate (TEOS), hydrogen silsesquioxane (HSQ) and methylsilsesquioxane (MSQ), an amorphous carbon (a-C), organic planarization layer (OPL), or combinations thereof.

An upper portion of the fill layer 190 can be removed using a directional (e.g., reactive ion etch (RIE) or isotropic etch (e.g., wet chemical etch) to expose a portion of the work function metal layer 180 on the top source/drains 140 and masking cap 150.

Figure 6:
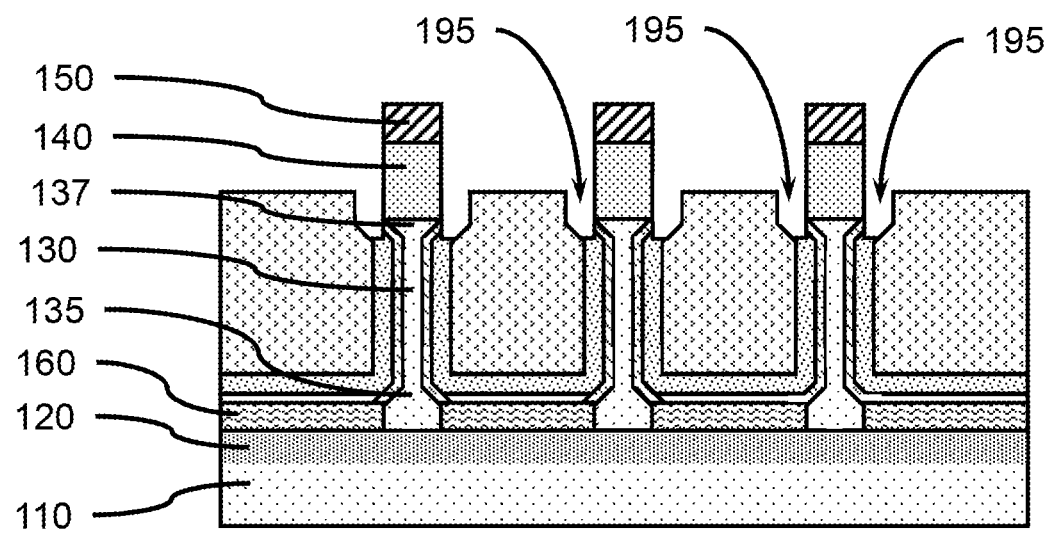
FIG. 6 is a cross-sectional view showing a fill layer on the plurality of vertical fins after removing a portion of the work function metal layer and gate dielectric layer, in accordance with an embodiment of the present invention.

FIG. 6 is a cross-sectional view showing a fill layer on the plurality of vertical fins after removing a portion of the work function metal layer and gate dielectric layer, in accordance with an embodiment of the present invention.

After exposing the work function metal layer 180, the exposed portion can be removed to expose the underlying gate dielectric layer 170, which can also be removed. The work function metal layer 180 can be removed using a selective, isotropic etch (e.g., wet chemical etch, dry plasma etch) and/or a selective directional etch (e.g., reactive ion etch (RIE)), where the isotropic etch can remove portions of the work function metal layer 180 above the top surface of the recessed fill layer 190, and the selective directional etch can remove a portion of the work function metal layer 180 below the fill layer 190. The masking cap 150 and thickness of the gate dielectric layer 170 on the masking cap 150 and top source/drain 140 can shadow the underlying work function metal layer 180 from the directional etch to form indents 195. The exposed gate dielectric layer 170 can be removed using a subsequent selective, isotropic etch (e.g., wet chemical etch, dry plasma etch). Removal of the portions of the work function metal layer 180 and gate dielectric layer 170 can form a thinner section of work function metal layer 180 on the adjoining gate dielectric layer 170 and adjacent to the upper tapered portion 137 of the vertical fin, where the etching forms the indent 195 into the work function metal layer 180 and fill layer 190. The shadowing of a portion of the work function metal layer 180 closer to the gate dielectric layer 170 can provide a margin for over etching the work function metal layer 180, since a portion of the work function metal layer 180 is self-aligned with the upper tapered portion 137 and junction with the top source/drain 140. A portion of the gate dielectric layer 170 can remain on the upper tapered portion 137.

An angled portion of the gate dielectric layer 170 can remain on the tapered upper portion 137 of the vertical fin 130, where the angled portion is neither perpendicular nor parallel with the surface of the substrate 110 or the plane of the vertical fin 130. The work function metal layer 180 can be removed down to the bottom of the tapered upper portion 137, where the positioning of the gate dielectric layer 170 on the upper tapered portion 137, and thinner section of work function metal layer 180 on the adjoining gate dielectric layer 170 can control the junction positions and reduce the variability of the junction positions, including underlap and overlap. A step can be formed by the indent 195 in the work function metal layer 180.

Figure 7:
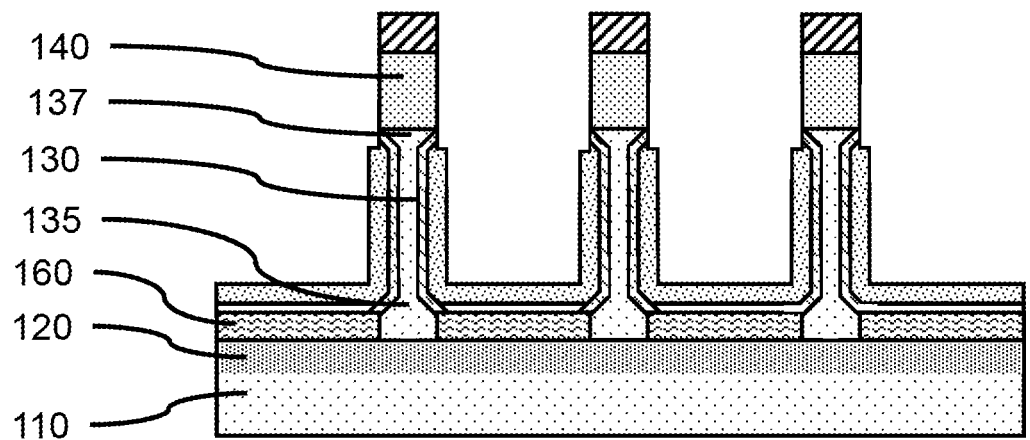
FIG. 7 is a cross-sectional view showing the plurality of vertical fins after removing the fill layer, in accordance with an embodiment of the present invention.

FIG. 7 is a cross-sectional view showing the plurality of vertical fins after removing the fill layer, in accordance with an embodiment of the present invention.

In one or more embodiments, the fill layer 190 can be removed using a selective etch (e.g., wet chemical etch) to expose the remaining portions of the work function metal layer 180 and top source/drains 140.

Figure 8:
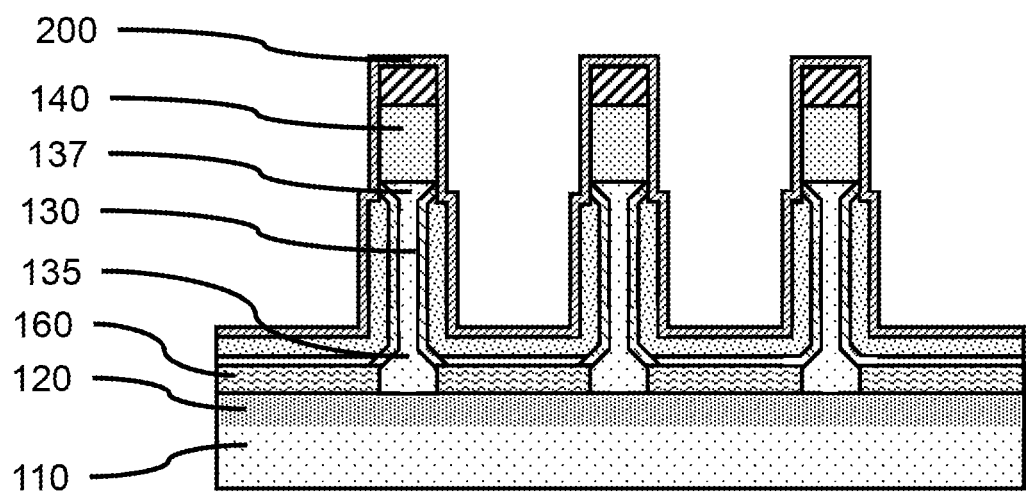
FIG. 8 is a cross-sectional view showing an encapsulation layer on the plurality of vertical fins and the remaining work function metal layer and top source/drains, in accordance with an embodiment of the present invention.

FIG. 8 is a cross-sectional view showing an encapsulation layer on the plurality of vertical fins and the remaining work function metal layer and top source/drains, in accordance with an embodiment of the present invention.

In one or more embodiments, an encapsulation layer 200 can be formed on the work function metal layer 180 and top source/drains 140, where the encapsulation layer 200 can be formed by atomic layer deposition (ALD) plasma enhanced ALD (PEALD), or a combination thereof.

In various embodiments, the encapsulation layer 200 can be silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof.

Figure 9:
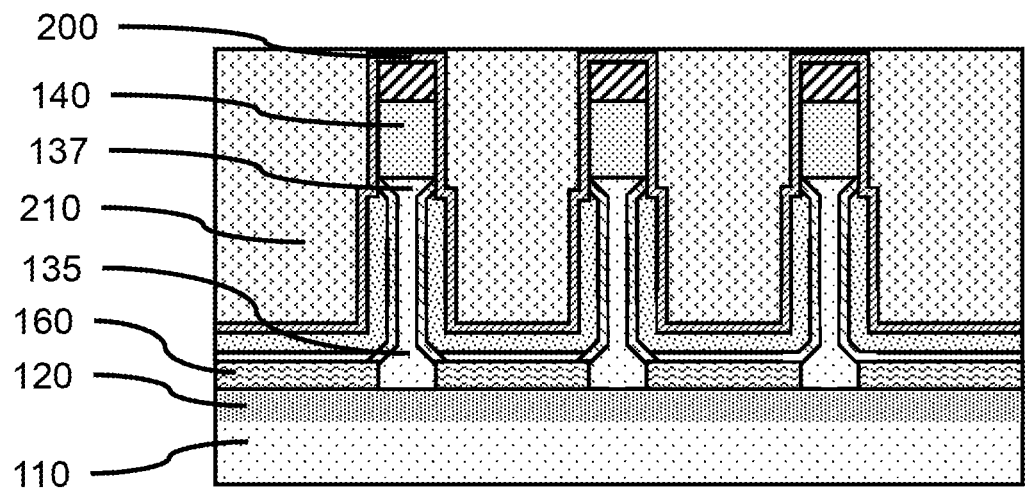
FIG. 9 is a cross-sectional view showing an interlayer dielectric (ILD) layer on the encapsulation layer and plurality of vertical fins, in accordance with an embodiment of the present invention.

FIG. 9 is a cross-sectional view showing an interlayer dielectric (ILD) layer on the encapsulation layer and plurality of vertical fins, in accordance with an embodiment of the present invention.

In one or more embodiments, an interlayer dielectric (ILD) layer 210 can be formed on the encapsulation layer 200 and plurality of vertical fins 130. The interlayer dielectric (ILD) layer 210 can be formed by a blanket deposition (e.g., CVD, spin-on). Portions of the interlayer dielectric (ILD) layer 210 deposited on and/or extending above the top surface of the encapsulation layer 200 on the masking cap 150 can be removed using a chemical-mechanical polishing (CMP) to provide a smooth, flat surface for subsequent processing.

Figure 10:
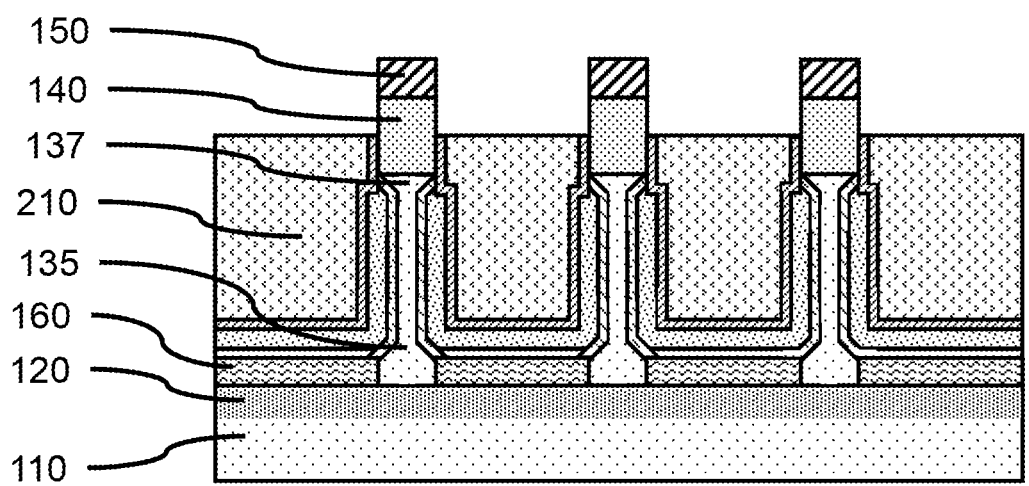
FIG. 10 is a cross-sectional view showing the plurality of vertical fins after removing a portion of the an interlayer dielectric (ILD) layer and encapsulation layer, in accordance with an embodiment of the present invention.

FIG. 10 is a cross-sectional view showing the plurality of vertical fins after removing a portion of the an interlayer dielectric (ILD) layer and encapsulation layer, in accordance with an embodiment of the present invention.

In one or more embodiments, the upper portion of the interlayer dielectric (ILD) layer 210 can be removed to expose a portion of the encapsulation layer 200. The upper portion of the interlayer dielectric (ILD) layer 210 can be removed using a selective, isotropic etch or selective, directional etch to reduce the height of the ILD layer 210 below the bottom surface of the masking cap 150. The exposed portion of the encapsulation layer 200 can be removed using a selective, isotropic etch to expose the masking caps 150 and an upper portion of the top source/drains 140 above the tapered upper portions 137.

Figure 11:
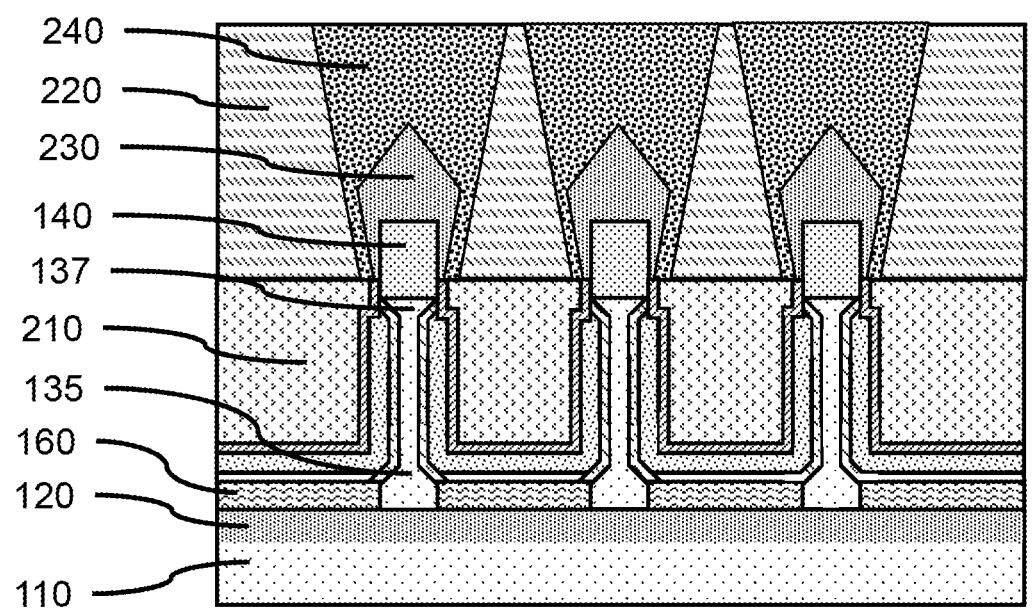
FIG. 11 is a cross-sectional view showing the plurality of vertical fins after enlarging the top source/drains and forming electrical contacts, in accordance with an embodiment of the present invention.

FIG. 11 is a cross-sectional view showing the plurality of vertical fins after enlarging the top source/drains and forming electrical contacts, in accordance with an embodiment of the present invention.

In one or more embodiments, the top source/drains 140 can be enlarged through epitaxial growth to form enlarged top source/drains 230, where the exposed surfaces of the top source/drains 140 can be used as an epitaxial growth surface. In various embodiments, the top source/drains 140 and enlarged top source/drains 230 can be doped to be an n-type source/drain, for example, with phosphorus (P), or a p-type source/drain, for example, with boron (B), where the top source/drains 140 and enlarged top source/drains 230 can be the same semiconductor material and have the same type of doping as the underlying bottom source/drain layer 120.

The epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

In one or more embodiments, a cover layer 220 can be formed on the ILD layer 210, where the cover layer 220 can be formed by the same processes and selected from the same materials as the ILD layer 210.

In various embodiments, electrical contacts 240 can be formed to each of the enlarged top source/drains 230 by masking the cover layer 220 and forming vias in the cover layer 220 that expose the enlarged top source/drains 230. The vias can be filled with a conductive material. The conductive fill can be doped polycrystalline or amorphous silicon, germanium, silicon-germanium, a metal (e.g., tungsten, titanium, tantalum, ruthenium, zirconium, cobalt, copper, aluminum, platinum, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive fill may further comprise dopants that are incorporated during or after deposition.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport field effect transistor, comprising:
    depositing a gate dielectric layer on a vertical fin having a thinned portion, tapered upper portion, and tapered lower portion, wherein the gate dielectric layer has an angled portion directly on each of the tapered upper portion and tapered lower portion;
    depositing a work function metal layer on the gate dielectric layer; and
    forming a fill layer on the work Function metal layer, wherein a portion of the work function metal layer is exposed above the top surface of the till layer.

2. The method of claim 1, wherein the thinned portion, tapered upper portion, and tapered lower portion of the vertical fin are formed using a non-isotropic wet chemical etch that preferentially removes the material of the vertical fins from specific crystal faces.

3. The method of claim 1, wherein the thinned portion of the vertical fin has a width in a range of about 2 nanometers (nm) to about 25 nm.

4. The method of claim 1, further comprising removing the exposed portion of the work function metal layer, and removing the portion of the gate dielectric layer above the angled portion on the tapered upper portion exposed by removing the portion of the work function metal layer.

5. The method of claim 4, further comprising removing the fill layer, and depositing an encapsulation layer on the work function metal layer.

6. The method of claim 5, further comprising depositing an interlayer dielectric (ILD) layer on the encapsulation layer, and removing a portion of the ILD layer to expose a portion of the encapsulation layer.

7. The method of claim 6, further comprising removing the exposed portion of the encapsulation layer.

8. The method of claim 7, further comprising depositing a cover layer on the ILD layer.

9. A method of forming a vertical transport field effect transistor, comprising:
    forming a bottom spacer layer on a bottom source/drain layer;
    depositing a gate dielectric layer on the bottom spacer layer and a thinned portion, tapered upper portion, and tapered lower portion of a vertical fin on the bottom source/drain layer, wherein the gate dielectric layer has an angled portion on each of the tapered upper portion and tapered lower portion; and depositing a work function metal layer on the gate dielectric layer.

10. The method of claim 9, further comprising forming a fill layer on the work function metal layer.

11. The method of claim 10, wherein a portion of the work function metal layer is exposed above the top surface of the fill layer, and removing the exposed portion of the work function metal layer and underlying gate dielectric layer to form indents.

12. The method of claim 11, wherein the work function metal layer has a thinner section and a step adjoining the gate dielectric layer on the tapered upper portion.

13. The method of claim 11, further comprising removing the fill layer.

14. A vertical transport field effect transistor, comprising:
a vertical fin including a thinner portion, an upper tapered portion, and a lower tapered portion on a bottom source/drain;
a gate dielectric layer on the vertical fin, wherein the gate dielectric layer has an angled portion on each of the upper tapered portion and lower tapered portion;
a work function metal layer on the gate dielectric layer, wherein a top edge of the work function metal layer is below the top edge of the gate dielectric layer on the upper tapered portion; and
an encapsulation layer on the work function metal layer.

15. The vertical transport field effect transistor of claim 14, further comprising a bottom spacer layer overlying the bottom source/drain, wherein at least a portion of the gate dielectric layer and work function metal layer overly the bottom spacer layer.

16. The vertical transport field effect transistor of claim 14, wherein the work function metal layer has a thinner section and a step adjoining the gate dielectric layer on the upper tapered portion.

17. The vertical transport field effect transistor of claim 14, further comprising an enlarged top source/drain on the upper tapered portion of the vertical fin.

18. The vertical transport field effect transistor of claim 17, wherein the encapsulation layer is adjacent to a portion of the enlarged top source/drain.

19. The vertical transport field effect transistor of claim 18, wherein the encapsulation layer is selected from the group of dielectric materials consisting of silicon nitride (SiN), silicon oxynitride (SiON), silicon boronitride (SiBN), silicon bon) carbonitride (SiBCN), silicon carbonitride (SiCN), silicon carbonitride (SiOCN), and combinations thereof.

* * * * *